US009608649B2

(12) United States Patent
Ek (10) Patent No.: US 9,608,649 B2
(45) Date of Patent: *Mar. 28, 2017

(54) ANALOG PHASE-LOCKED LOOP WITH ENHANCED ACQUISITION

(71) Applicant: Telefonaktiebolaget L M Ericsson (publ), Stockholm (SE)

(72) Inventor: Staffan Ek, Malmö (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

This patent is subject to a terminal disclaimer.

(21) Appl. No.: 14/982,910

(22) Filed: Dec. 29, 2015

(65) Prior Publication Data

US 2016/0112056 A1    Apr. 21, 2016

Related U.S. Application Data

(63) Continuation of application No. 14/362,563, filed as application No. PCT/EP2012/072638 on Nov. 14, 2012, now Pat. No. 9,252,786.

(Continued)

(30) Foreign Application Priority Data

Dec. 7, 2011   (EP) .................................. 11192433

(51) Int. Cl.
   *H03L 7/087* (2006.01)
   *H03L 7/10* (2006.01)
   (Continued)

(52) U.S. Cl.
   CPC ................ *H03L 7/10* (2013.01); *H02M 3/07* (2013.01); *H03L 7/087* (2013.01); *H03L 7/089* (2013.01);
   (Continued)

(58) Field of Classification Search
   CPC ....................................................... H03L 7/087
   See application file for complete search history.

(56) References Cited

U.S. PATENT DOCUMENTS

| 5,142,246 A * | 8/1992 | Petersson ............... H03L 7/087 331/11 |
| 6,281,712 B1 * | 8/2001 | Martin ................. H03D 13/004 327/12 |

(Continued)

OTHER PUBLICATIONS

Collins, Diarmuid et al., "Fast Frequency Calibration of VCO's in Phase-Locked Loops", ISSC. Cork, Ireland. Jun. 23-24, 2010, 1-5.

(Continued)

*Primary Examiner* — Tuan H Nguyen
(74) *Attorney, Agent, or Firm* — Murphy, Bilak & Homiller, PLLC (57) ABSTRACT

An analog phase-locked loop (PLL) is disclosed, comprising a voltage controlled oscillator (VCO); a frequency divider having its input connected to an output of the VCO; a first phase detector arranged to detect a phase difference between an output signal of the frequency divider and a reference frequency signal and provide an output signal based on the phase difference, wherein the detectable phase difference is within one cycle of the reference frequency; a first charge pump connected to an output of the first phase detector and arranged to output a charge per detected phase error based on the output of the first phase detector; and an analog loop filter connected to the first charge pump and arranged to provide a voltage, based on the output of the first charge pump, to the VCO. The PLL further comprises a second phase detector arranged to detect a number of cycles in phase difference between the output signal of the frequency divider and the reference frequency signal and provide an output signal based on the number of cycles in phase difference; and a second charge pump connected to an output (Continued)

of the second phase detector and arranged to provide a charge per detected phase error, based on the output of the second phase detector, to the loop filter. A radio circuit, a communication device and a communication node are also disclosed.

20 Claims, 6 Drawing Sheets

Related U.S. Application Data (60) Provisional application No. 61/570,378, filed on Dec. 14, 2011.

(51) Int. Cl.
*H03L 7/089* (2006.01)
*H04B 1/40* (2015.01)
*H02M 3/07* (2006.01)
*H03L 7/093* (2006.01)
*H03L 7/099* (2006.01)
*H04L 7/033* (2006.01)

(52) U.S. Cl.
CPC ............. *H03L 7/093* (2013.01); *H03L 7/099* (2013.01); *H04B 1/40* (2013.01); *H04L 7/0331* (2013.01)

(56) References Cited

U.S. PATENT DOCUMENTS

| 6,442,225 | B1 | 8/2002 | Huang | |
|---|---|---|---|---|
| 7,622,996 | B2 * | 11/2009 | Liu | H03L 7/087 331/10 |
| 2007/0025490 | A1 | 2/2007 | Azadet et al. | |
| 2008/0061888 | A1 | 3/2008 | Liu | |

OTHER PUBLICATIONS

Keaveney, Mike et al., "A 10μs Fast Switching PLL Synthesizer for a GSM/EDGE Base-Station", IEEE International Solid-State Circuits Conference. ISSCC 2004, Feb. 17, 1-10.

Kuang, Xiaofei et al., "A Fast-Settling PLL Frequency Synthesizer with Direct Frequency Presetting", IEEE International Solid-State Circuits Conference. ISSCC, Feb. 7, 2006, 1-10.

Shin, Jaewook et al., "A Fast and High-Precision VCO Frequency Calibration Technique for Wideband Fractional-N Frequency Synthesizers", IEEE Transactions on Circuits and Systems-I: Regular Papers, vol. 57, No. 7, Jul. 2010, 1573-1582.

Unknown, Author, "Fractional-N/Integer-N PLL Synthesizer", Analog Devices. ADF4150, 2011, 1-28.

Vaucher, Cicero S., "An Adaptive PLL Tuning System Architecture Combining High Spectral Purity and Fast Settling Time", IEEE Journal of Solid-State Circuits, vol. 35, No. 4., Apr. 2000, 490-502.

* cited by examiner

ANALOG PHASE-LOCKED LOOP WITH ENHANCED ACQUISITION

RELATED APPLICATIONS

The present application is a continuation of U.S. patent application Ser. No. 14/362,563, filed 3 Jun. 2014, which was a national stage entry under 35 U.S.C. §371 of international patent application serial no. PCT/EP2012/072638, filed 14 Nov. 2012, which claimed the benefit of U.S. provisional application Ser. No. 61/570,378, filed 14 Dec. 2011 and EP application serial no. EP11192433.8, filed 7 Dec. 2011. The entire contents of each of these applications are incorporated herein by reference.

TECHNICAL FIELD

The present invention generally relates to an analog phase-locked loop. The invention particularly relates to improved acquisition in an analog phase-locked loop. The invention also relates to a radio circuit, a communication device and a communication node arranged for improved acquisition.

BACKGROUND

In the field of analog Phase Locked Loops (PLLs), where the output of the circuit is an oscillator signal, phase locked to an input reference signal, the phase accuracy of the output signal is highly dependent of the input phase detector resolution. The phase detector should preferably also be able to handle large phase errors during acquisition. This is relevant in particular for PLLs with large output frequency range, but moderate phase accuracy requirements where a large sensitivity of the Voltage Controlled Oscillator (VCO) can be used to cover the frequency range. Existing analog phase detectors most commonly have high resolution but cannot detect phase errors larger than 2π radians.

Figure 8:
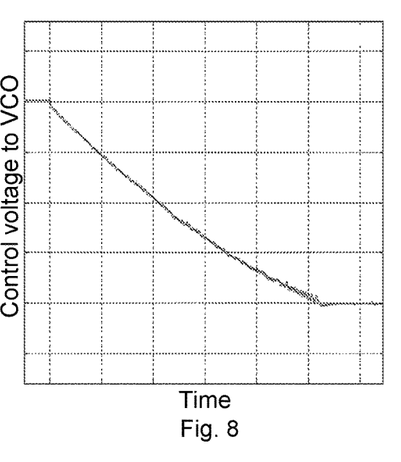
FIG. 8 is a chart illustrating control voltage to VCO over time at frequency switching according to a traditional analog PLL.

The inability to detect large phase errors results in slow acquisition during, for example, start-up and frequency switching. Even if the phase error is several multiples of 2π, the phase detector will only output a fraction of 2π and indicate that the phase error is smaller than it actually is. The charge pump, which should pull the loop voltage and, in turn, the VCO to the correct frequency, will not work as efficiently as it could. FIG. 8 illustrates a typical behaviour of the control signal to the VCO at a frequency switch. Several methods to circumvent this problem exist, where the most commonly used is switching to a larger bandwidth of the PLL during acquisition.

Examples of such solutions are provided in U.S. Pat. No. 6,281,712 and US 2008/061888. U.S. Pat. No. 6,281,712 discloses a phase detector circuit operating at a high frequency and having a steering circuit operating on frequency-divided versions of the phase detector signals. The phase detector implements steering by adding dividers at both input ports to the steering circuit. US 2008/061888 discloses a multi-loop PLL circuit having a first loop for generating a first control current and a second loop for generating a second control current. Dual frequency dividing functions are provided for feedback clock signals. The frequency of a second reference clock signal is higher than that of a first reference clock signal. The first reference clock signal and one of the feedback clock signals are compared by a first phase/frequency detector of the first loop, and the second reference clock signal and the other of the feedback clock signals are compared by a second phase/frequency detector of the second loop.

U.S. Pat. No. 6,442,225 discloses a multi-phase-locked loop for data recovery which generates and outputs multiple sets of control signals via a multi-phase VCO which generates a plurality of multi-phase clock signals for detecting a transition edge of a data signal. A multi-phase-locked loop without dead zone can thereby be provided.

Another method for faster acquisition is look-up table based pre-charging of the loop filter or capacitance switching in the VCO. Initial measurements of the VCO frequency characteristics are stored in a table and used later on when switching frequency. In that way, frequency acquisition may be almost instantaneous, but requires a phase locking period after switching.

A third method for fast acquisition commonly used for PLLs with large output frequency range and stringent requirements on output phase accuracy, includes digital calibration of the VCO. The loop filter voltage is held constant and the analog loop is replaced by digital circuitry during acquisition. When phase lock is achieved, the analog loop is switched back in again for phase accuracy. The digital loop used during acquisition may have very large bandwidth to speed up settling.

The methods described above improve the settling times to different extents, but also have their downsides. The most commonly used method of switching to a larger bandwidth during settling is normally done by increasing the charge pump current, which yields a larger loop gain. However, this requires some additional measures and circuitry in order not to create instability of the loop, e.g., switching to a smaller loop filter zeroing resistance. However, the available charge pump current still is not very effectively used. An issue with the look-up table approach can be that it requires an initial state at start-up where the VCO characteristics are measured and stored in the look-up table.

The mentioned method of digital calibration during acquisition may be very quick and for PLLs where digital control of the VCO is needed, also to split the VCO tuning curves into several for smaller sensitivity, this is the preferred method. Though it is clear that this requires extensive digital hardware, loop filter pre-charging circuitry and, for PLLs with analog tuning only, digital controllability of the VCO would have to be added.

Still, for pure analog PLLs, there is a need to improve acquisition.

SUMMARY

An object of the invention is to at least alleviate the above stated problem. The present invention is based on the understanding that a further phase detector, in addition to the traditional phase detector of an analog PLL, can be introduced that is able to detect phase errors as integer multiples of 2π during PLL acquisition. The detected phase error controls a further charge pump which pumps currents to the loop filter, essentially proportional to the detected phase error. The further charge pump can have the capability of pumping currents larger than the charge pump arranged with the traditional phase detector. The further charge pump can be realized with less accurate current sources than the main charge pump and thus it must not occupy a large area.

When phase lock is achieved the further phase detector and charge pump may be switched off in order not to interfere with the main phase detector and charge pump, which may be enabled during acquisition or not. For simplicity the same loop parameters may be used during acquisition as during steady state or if further improved settling speed is wanted, a bandwidth switch may be used.

According to a first aspect, there is provided an analog phase-locked loop, (PLL) comprising a voltage controlled oscillator; a frequency divider having its input connected to an output of the VCO; a first phase detector arranged to detect a phase difference between an output signal of the frequency divider and a reference frequency signal and provide an output signal on an output of the first phase detector based on the phase difference, wherein the detectable phase difference is within one cycle of the reference frequency; a first charge pump connected to the output of the first phase detector and arranged to output a charge per detected phase difference based on the output signal on the output of the first phase detector; and an analog loop filter connected to the first charge pump and arranged to provide a voltage, based on the output of the first charge pump, to the VCO. The PLL is characterised by a second phase detector arranged to detect a number of cycles in phase difference between the output signal of the frequency divider and the reference frequency signal and provide an output signal based on the number of cycles in phase difference; and a second charge pump connected to an output of the second phase detector and arranged to provide a charge per detected phase error, based on the output of the second phase detector, to the loop filter.

The first and second charge pumps may be arranged such that the second charge pump will, when one or more cycles in phase difference are detected by the second phase detector, provide a charge, per detected non-zero phase difference by the second phase detector, with absolute value that is larger than an absolute value of charge provided by the first charge pump during the same period.

The PLL may further comprise a phase lock detector arranged to detect whether the PLL is in a phase-locked state. The second phase detector and the second charge pump may be arranged to be switched off when the phase lock detector determines a phase-locked state.

The PLL may further comprise a control input arranged to receive a signal indicating fast acquisition request, wherein upon reception of such request, the second phase detector and second charge pump are forced to an on-state.

The second phase detector may comprise two edge counters and a subtractor. A first edge counter of the two edge counters may be arranged to count edges of the reference frequency signal, and a second edge counter of the two edge counters may be arranged to count edges of the output signal of the frequency divider. The subtractor may be arranged to subtract a count provided by one of the edge counters from a count provided by the other one of the edge counters, wherein the output signal of the subtractor forms the output signal of the second phase detector.

The second phase detector may comprise two counters and a subtractor. A first counter of the two counters may be arranged to count edges of the reference frequency signal, and a second counter of the two counters may be arranged to count edges of the output signal of the voltage controlled oscillator. The first counter may be arranged to increase its value for each edge by a product of a division value of the frequency divider and count provided by the second counter, and the subtractor is arranged to subtract a count provided by one of the edge counters from a count provided by the other one of the edge counters, wherein the output signal of the subtractor forms the output signal of the second phase detector.

The second phase detector may comprise an up/down counter having one input for up-count and another input for down-count and an output providing an aggregated count formed by the difference in cycles of the inputs, wherein the output signal of the up/down counter forms the output signal of the second phase detector. The up/down counter may comprise two ripple counters, preferably a first set of synchronisation registers, a subtractor, and preferably a second set of synchronisation registers. The first ripple-counter may be arranged to count the reference frequency signal, and the second ripple-counter may be arranged to count the divided frequency signal. The optional first set of synchronisation registers may be arranged to enable the output signal of the second ripple-counter to be synchronously subtracted from the output signal of the first ripple-counter in the subtractor. The output signal of the subtractor may be provided to the second set of optional synchronisation registers to be provided as an output signal of the up/down counter.

The second charge pump may comprise a plurality of current sources connected via respective switches, which may be individually controlled by the output signal of the second phase detector, to provide the current output of the second charge pump. The provided respective currents of the plurality of current sources may be weighted such that the plurality of current sources together are able to provide an aggregate current, together with the switches, corresponding to the output signal of the second phase detector. A first current source of the current sources may be weighted to provide a double amount of current than a second current source of the current sources, and the second current source may be weighted to provide a double amount of current than a third current source of the current sources, and so on. The switches may be controlled based on the output signal of the second phase detector accordingly. The current sources may alternatively be equally weighted, and the switches may be controlled to connect an amount of current sources to the output of the second charge pump corresponding to the output signal of the second phase detector.

The PLL may further comprise a decoder arranged to receive the output signal of the second phase detector and provide control to the switches such that the provided current corresponds to the phase difference detected and output by the second phase detector. The decoder may be a binary decoder.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
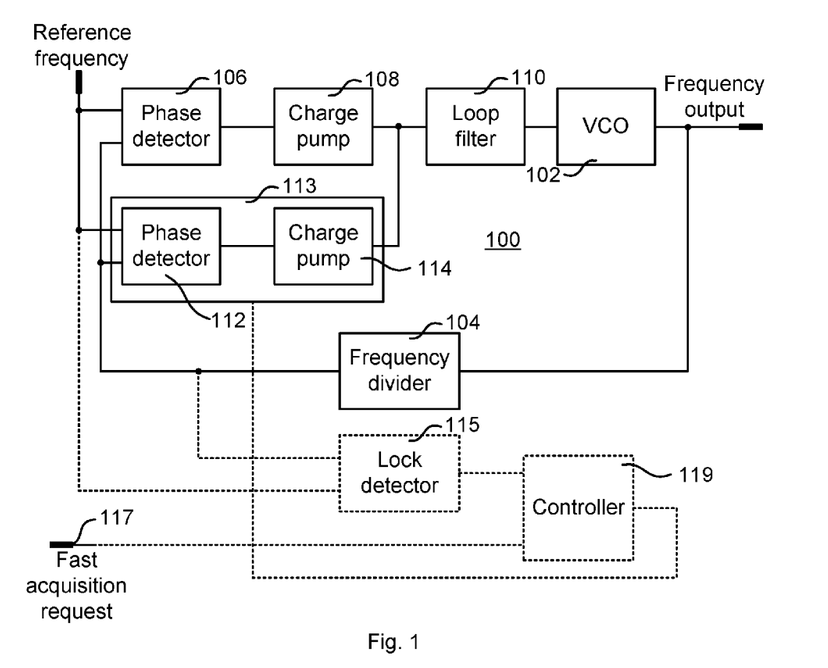
FIG. 1 illustrates a PLL according to an embodiment, where dotted lines indicate optional features.

FIG. 1 illustrates a PLL 100 according to an embodiment. The PLL 100 comprises a VCO 102, a frequency divider 104, a main phase detector 106, a main charge pump 108, and an analog loop filter 110. So far, the PLL 100 resembles a traditional analog PLL. The VCO 102 provides an output signal with a frequency controlled by a voltage on the input of the VCO 102. That signal is also the output of the PLL 100. That signal is also connected to the frequency divider 104 which divides the frequency and provides a desired fraction thereof as the frequency of the output signal of the frequency divider 104. The divided frequency signal is connected to one of the inputs of the main phase detector 106, which compares the divided frequency signal with a reference frequency signal connected to the other input of the main phase detector 106. The output of the main phase detector 106 is connected to a main charge pump 108. The output of the main phase detector 106 reflects the phase difference between the reference frequency signal and the divided frequency signal. The main phase detector 106 is of conventional type, and can thus only determine phase difference within one cycle of the reference frequency signal, i.e., within $2\pi$ radians.

The charge pump 108 provides an output charge per detected phase error corresponding to the output of the main phase detector 106 to the analog loop filter 110, which also is of conventional type. The loop filter 110 provides the voltage that controls the VCO 102 to provide an output signal with a certain frequency.

The features described so far resemble the ones of a conventional analog PLL. The feedback structure of the PLL 100 provides for an output signal that has a frequency and phase that is determined by the reference frequency signal and the division value provided by the frequency divider 104. If the division value is one, the output frequency will be equal to the reference frequency, and if the division value is two, the output will have a frequency that is twice the frequency of the reference frequency signal, etc. The frequency divider 104 can be arranged to be controlled to set a desired division value based on a control signal. Thereby, the PLL 100 can provide a desired frequency of the output signal. Upon, for example, start-up or when a frequency switch occurs, i.e., the frequency divider 104 changes its division value, it is desirable that the output signal of the PLL 100 quickly stabilises to provide the desired output frequency.

Figure 9:
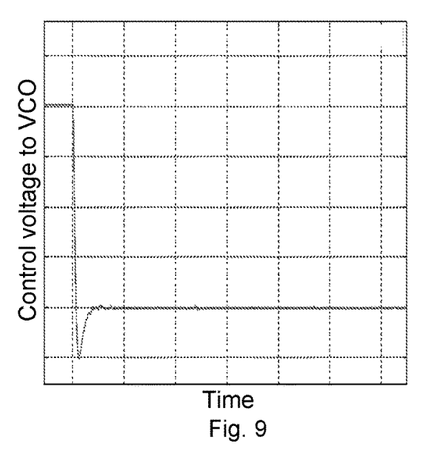
FIG. 9 is a chart illustrating control voltage to VCO over time at frequency switching according to an analog PLL according to an embodiment, using the same scale as FIG. 8 for convenient comparison.

At such occurrences, the traditional PLL takes some time to stabilise, e.g., as illustrated in the chart of FIG. 8. To make that process swifter, a further phase detector 112 and a further charge pump 114 are provided. The further phase detector 112 is of a different type than the main phase detector 106, and is able to detect phase shifts in a wider range than the $2\pi$ radians that the main phase detector 106 is able to do. Roughly said, the further phase detector 112 checks how many cycles out of phase the divided frequency signal is compared to the reference signal. The further phase detector 112 provides a measure of the phase error to the further charge pump 114, which then provides a corresponding current to the analog loop filter. The current addition of the provided currents from the main charge pump 108 and the further charge pump 114 is naturally such, since the absolute value of the charge, per detected non-zero phase error by the further phase detector 112, provided by the further charge pump 114 normally is larger than the absolute value of the charge provided by the main charge pump 108 during the same time period due to the respective charges are essentially proportional to the detected phase errors, that the contribution from the further charge pump 114 is dominant at fast frequency acquisition. The higher current provided to the analog loop filter 110 provides for a faster change in control voltage to the VCO 102. An example is illustrated in the chart of FIG. 9. It should be noted that the frequency switch situation and scales of FIGS. 8 and 9 are the same for convenient comparison.

During acquisition the further circuits 113, i.e., the further phase detector 112 and the further charge pump 114, are enabled, aiding the settling of the PLL, while the circuits 113 may be disabled when stable operation is reached to provide reduced energy consumption and/or reduced interference with the main phase detector 106.

The further charge pump 114 can be implemented with less accurate current sources than the main charge pump and thus it must not occupy a large area. The coarse phase errors handled by the further phase detector 112, and corresponding currents, will work with such less accurate current sources, and the main phase detector 106 and main charge pump 108 will take care of the more fine tuning work of the PLL 100.

When phase lock is achieved, a circuit block 113 comprising the further phase detector 112 and charge pump 114 may be switched off in order not to interfere with the main phase detector 106 and charge pump 108, and the circuit block 113 can be enabled only during fast phase acquisition, e.g., at start-up or frequency shift.

The PLL 100 can optionally comprise a phase lock detector 115 arranged to detect whether the PLL 100 is in a phase-locked state, wherein the circuit block 113 with the second phase detector 112 and the second charge pump 114 is arranged to be switched off when the phase lock detector determines a phase-locked state. The phase lock detector 115 can, for example, monitor the reference frequency and the output of the frequency divider 104 to determine a locked state. An output of the phase lock detector 115 can be connected to the circuit block 113 to enable/disable its function.

Alternatively, or additionally, the PLL 100 can comprise an external input 117 arranged to receive a fast acquisition request control signal indicating fast phase acquisition request, wherein upon reception of such request, the second phase detector and second charge pump (113) are forced to an on-state.

The signals from the lock detector 115 and/or the external input 117 can be provided to a controller 119 which is arranged to control the on/off state of the circuit block 113. The controller 119 can also take other signals into account for the control.

Figure 2:
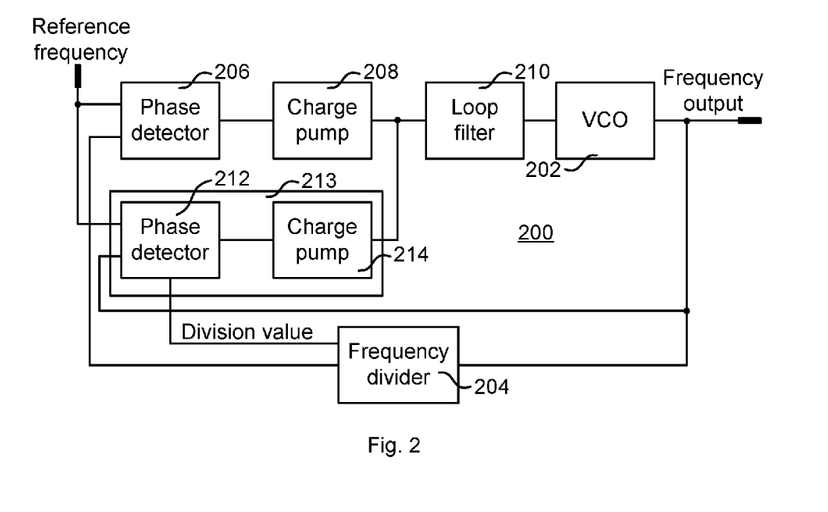
FIG. 2 illustrates a PLL according to an embodiment.

FIG. 2 illustrates an alternative embodiment of a PLL 200. Similar to the embodiment of FIG. 1, the PLL 200 comprises a VCO 202, a frequency divider 204, a main phase detector 206, a main charge pump 208, and an analog loop filter 210. These elements are interconnected the same way as described for the embodiment of FIG. 1. The PLL 200 also comprises a further phase detector 212 and a further charge pump 214. The embodiment of FIG. 2 differs from the embodiment of FIG. 1 in that the further phase detector 212 is arranged to determine phase error between the reference frequency signal and the output signal of the VCO 202. The further phase detector 212 also has an input connected to the frequency divider 204 such that the further phase detector 212 knows the desired difference in frequency between the reference frequency signal and the output signal from the VCO 202. An advantage of this setup, considering the function of the further phase detector 212 to count the cycles in difference to the reference frequency signal, is that the granularity of such count is increased by the division value of the frequency divider 204. Similar to the embodiment of FIG. 1, the further phase detector 212 provides an output reflecting the phase error to the further charge pump 214, which, in turn, provides a corresponding current to the analog loop filter 210.

A circuit block 213 comprising the further phase detector 212 and the further charge pump 214 can, as also demonstrated for the embodiment of FIG. 1, be switched off when not needed. The optional features demonstrated with reference to FIG. 1, i.e., provision of phase lock detector, external input for fast acquisition request, and/or controller, are also applicable to the embodiment of FIG. 2 although not depicted.

Figure 3:
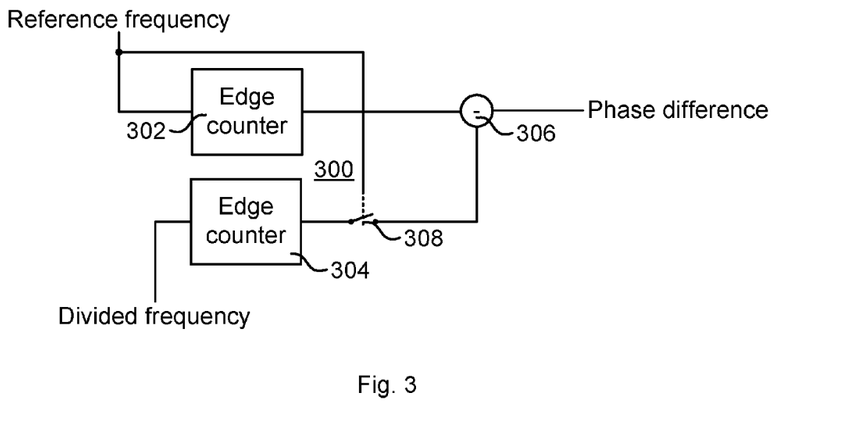
FIG. 3 illustrates a phase detector according to an embodiment.

FIG. 3 schematically illustrates a phase detector 300 suitable for being used as the further phase detector 112 of FIG. 1. The phase detector 300 comprises two edge counters 302, 304 and a subtractor 306. A first edge counter 302 of the two edge counters is arranged to count edges of the reference frequency signal, a second edge counter 304 of the two edge counters is arranged to count edges of the output signal of the frequency divider, and the subtractor 306 is arranged to subtract a count provided by the second edge counter 304 from a count provided by the first edge counter 302, wherein the output of the subtractor 306 forms the output of the phase detector 300. It should be understood that the sign of the output, that would indicate which number that is subtracted from which, is not important as long as the PLL is connected in a negative feedback fashion. Thus, the count of the reference frequency signal can be subtracted from the count of the divided frequency signal, or vice versa. The counting can be sampled, illustrated by a switch 308 controlled by the reference frequency signal. That is, the counters can be zeroed, and during one or a few cycles of the reference frequency signal, the edge counts from respective counters 302, 304 can be provided to the subtractor 306 which outputs the difference as a measure of the phase error, the counters are zeroed again, and so on. It is also possible to operate the counters without zeroing if any overflow is managed in the subtraction.

Figure 4:
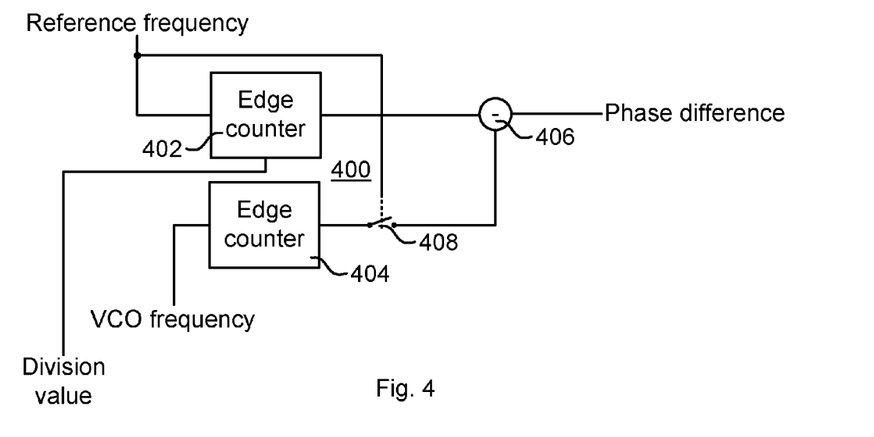
FIG. 4 illustrates a phase detector according to an embodiment.

FIG. 4 schematically illustrates a phase detector 400 suitable for being used as the further phase detector 212 of FIG. 2. The phase detector 400 comprises two edge counters 402, 404 and a subtractor 406. A first edge counter 402 of the two edge counters is arranged to count edges of the reference frequency signal, a second edge counter 404 of the two edge counters is arranged to count edges of the output signal of the VCO, and the subtractor 406 is arranged to subtract a count provided by the second edge counter 404 from a count provided by the first edge counter 402, wherein the output of the subtractor 406 forms the output of the phase detector 400. Here, the first edge counter 402 receives information about the division value of the frequency divider. That is, for each edge counted on the reference frequency signal, the count is increased by the division value. The counting can be sampled, illustrated by a switch 408 controlled by the reference frequency signal. That is, the counters can be zeroed, and during one or a few cycles of the reference frequency signal, the edge counts from respective counters 402, 404, i.e., with consideration of the increase by the division value from the first edge counter 402, can be provided to the subtractor 406 which outputs the difference as a measure of the phase error, the counters are zeroed again, and so on. It is also possible to operate the counters without zeroing if any overflow is managed in the subtraction. It should be understood that the sign of the output, that would indicate which number that is subtracted from which, is not important as long as the PLL is connected in a negative feedback fashion. Thus, the count of the reference frequency signal can be subtracted from the count of the VCO signal, or vice versa.

According to an embodiment, a single counter can be used. The single counter would then be arranged to have ability to count up and down, e.g., have one input counting pulses or edges up and another input counting pulses or edges down wherein the output becomes the difference in pulses or edges provided at the inputs. An example of such counter is demonstrated with reference to FIG. 5, but other implementations are also feasible and are known as up/down counters in the art. An advantage of an up/down counter is that no separate subtractor is needed.

Figure 5:
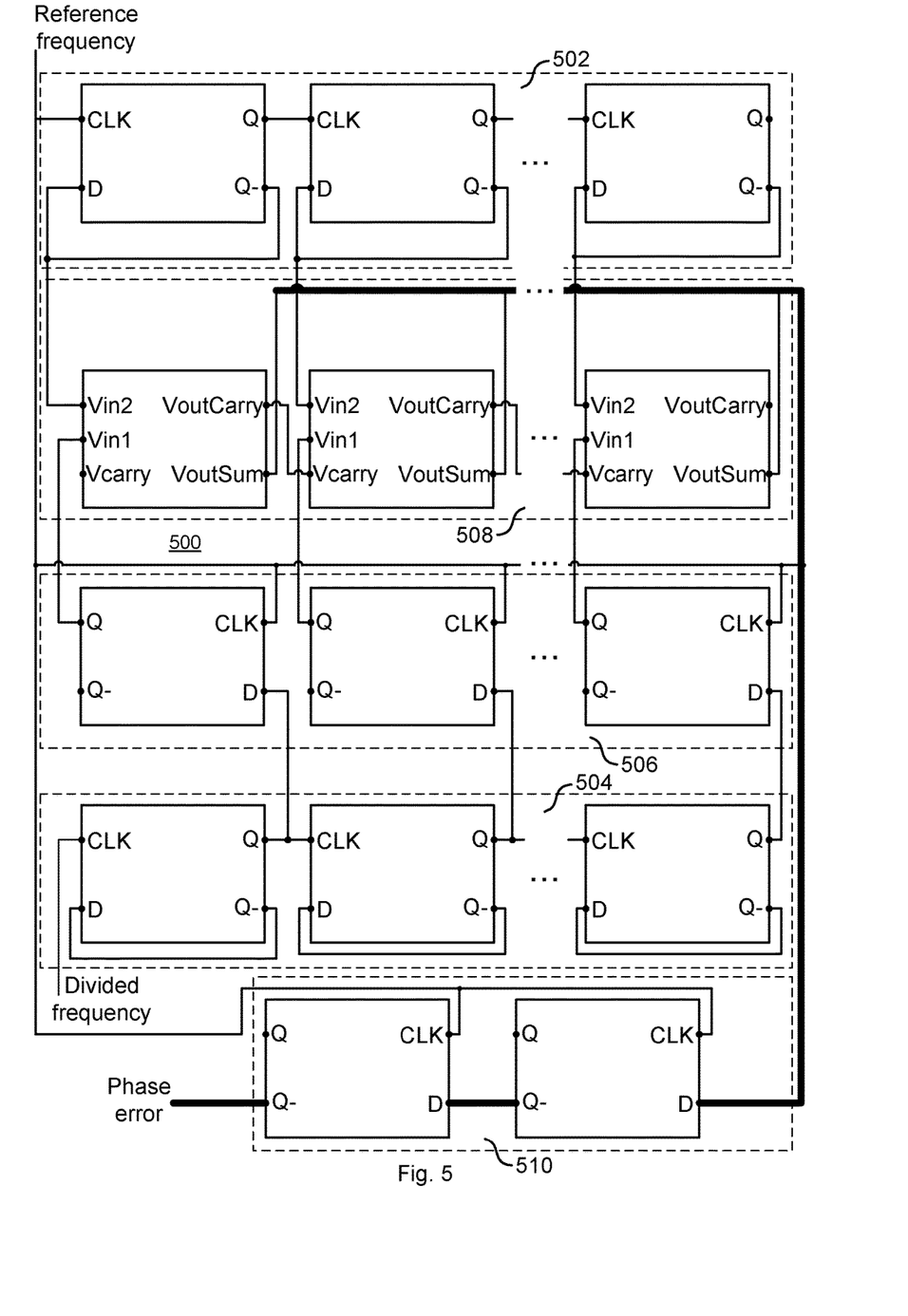
FIG. 5 illustrates a phase detector according to an embodiment.

FIG. 5 schematically illustrates a phase detector 500 suitable for being used as the further phase detector 112 of FIG. 1. The phase detector 500 is formed by two asynchronous ripple-counters 502, 504, e.g., made from T flip-flops, which, in turn, can be made of D flip-flops, JK flip-flops, SR flip-flops, etc., optional synchronisation registers 506, 510, e.g., made from D flip-flops, and a subtractor 508, e.g., made from full adders. The optional synchronisation registers 506, 510 are not necessary for the function, but provides the advantage that work load for the following subtractor 508 is decreased. A first asynchronous ripple-counter 502 counts the reference frequency signal, a second asynchronous ripple-counter 504 counts the divided frequency signal, a first set of synchronisation registers 506 enables the output of the second asynchronous ripple-counter 504 to be synchronously subtracted from the output of the first asynchronous ripple-counter 502 in the subtractor 508. The output of the subtractor 508 is provided to a second set of synchronisation registers 510 to be provided as an output from the phase detector 500 as the determined phase error. The number of output synchronisation registers of the second set of synchronisation registers 510 is not important for the principles of operation. If there is a first set of synchronisation registers 506 between the oscillator counter and the subtractor there are cases when the second set of synchronisation registers can be omitted. The size of the counters 502, 504, i.e., the number of flip-flops, should be selected such that, in a bit-wise way, the proper phase error is enabled to be output. An advantage of the phase detector 500 is that it can be continuously operated in the sense that zeroing of the ripple-counters 502, 504 is not necessary. The phase detectors demonstrated with reference to FIGS. 3 to 5 enable a low-complexity implementation, and the embodiment demonstrated with reference to FIG. 5 is particularly silicon area and power saving.

Figure 6:
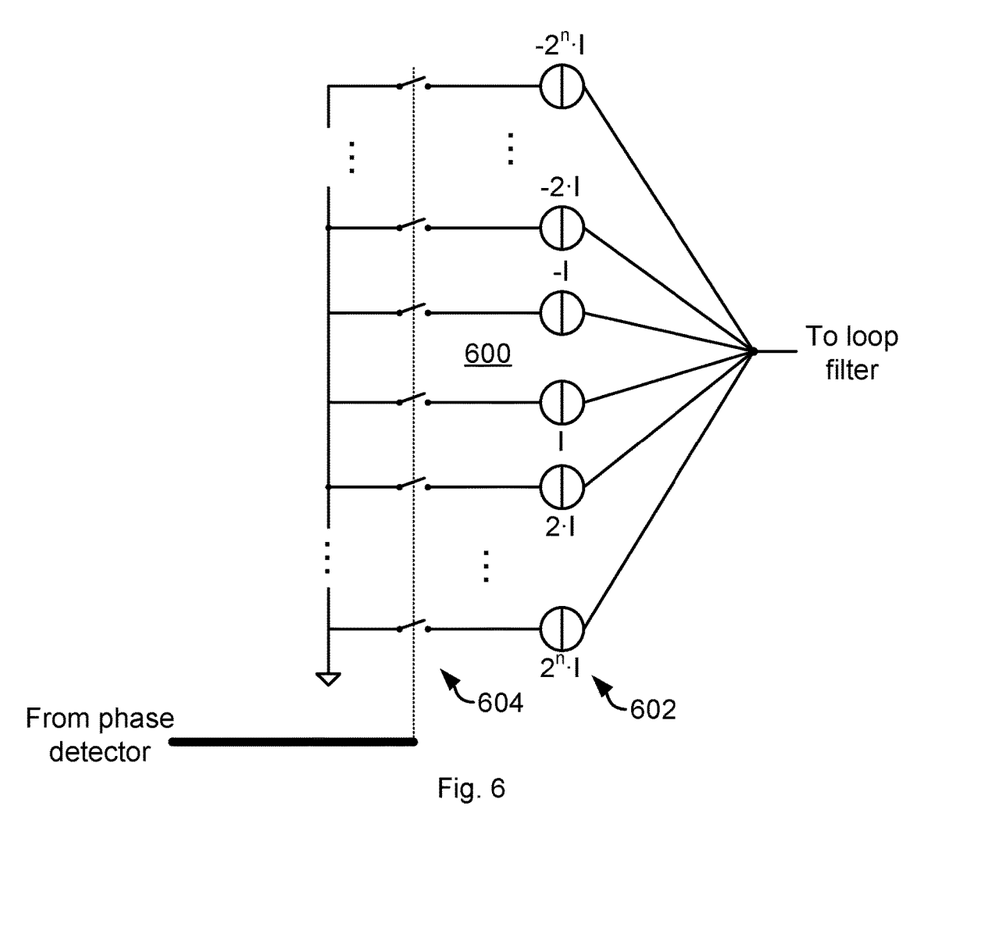
FIG. 6 illustrates a charge pump according to an embodiment.

FIG. 6 schematically illustrates a charge pump 600 suitable to be used as the further charge pump 114, 214 of any of FIGS. 1 and 2. The charge pump 600 comprises a plurality of current sources 602 which are arranged to be connected to the output by a corresponding plurality of switches 604. The switches 604 are controlled based on the phase error output from the phase detector, and each switch enables or disables its corresponding current source to provide its contribution to the output current of the charge pump 600. The nature of a current contribution makes it possible to provide the switches anywhere in the circuit between a reference node and the output; that is, the switches 604 and the current sources 602 can as well switch places in FIG. 6. Further, as is denoted by a minus sign for half of the current sources 602 in FIG. 6, the charge pump 600 is able to both provide current to a subsequent loop filter and to pull current from the subsequent loop filter, depending on the setting of the switches 604. Thus, both positive and negative phase errors are enabled to be handled.

The current sources 602 are arranged such that a first one (at bottom of FIG. 6) provides twice the current as a second one (not shown in FIG. 6) and so on to provide a granularity of output current from the charge pump 600 similar to what is seen in binary number representation. Thus, the uppermost positive current source in FIG. 6, indicated to provide the current I, defines the finest granularity of provided current, while the maximal provided current is almost twice the amount of the lowermost current source in FIG. 6, i.e., $2^n \cdot I - 1$. A decoder (not shown), arranged to decode the phase error signal from the phase detector can be provided. The decoder can be a simple combinatory network. Alternatively, the phase decoder and/or the switching arrangement 604 can be adapted to enable use of the phase error signal directly.

The moderate requirements on linearity make the charge pump 600 particularly suitable, and the lean requirements on control logic in the solution makes it particularly advantageous.

Figure 7:
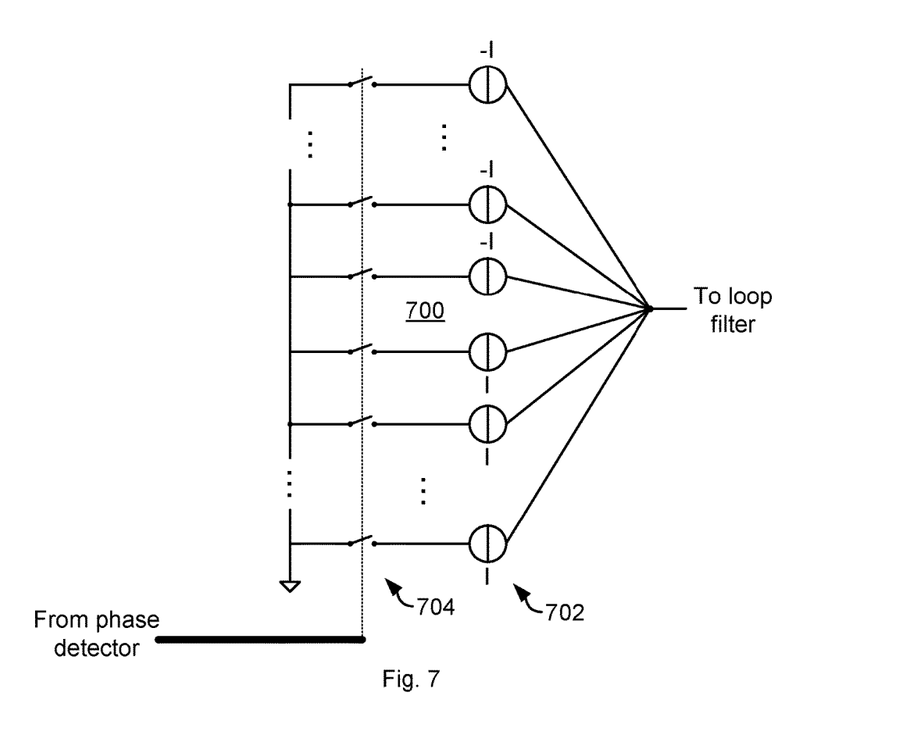
FIG. 7 illustrates a charge pump according to an embodiment.

FIG. 7 schematically illustrates a charge pump 700 suitable to be used as the further charge pump 114, 214 of any of FIGS. 1 and 2. The charge pump 700 comprises a plurality of current sources 702 which are arranged to be connected to the output by a corresponding plurality of switches 704. The switches 704 are controlled based on the phase error output from the phase detector, and each switch enables or disables its corresponding current source to provide its contribution to the output current of the charge pump 700. The nature of a current contribution makes it possible to provide the switches anywhere in the circuit between a reference node and the output; that is, the switches 704 and the current sources 702 can as well switch places in FIG. 7.

The current sources 702 are arranged to all provide an equal amount of current I. The switching arrangement 704 is thus arranged to close the amount of switches needed to provide the desired output current of the charge pump 700. The amount of switches to be closed is thus essentially proportional to the phase error. Linearity of the output is therefore easily achieved. Further, as is denoted by a minus sign for half of the current sources 702 in FIG. 7, the charge pump 700 is able to both provide current to a subsequent loop filter and to pull current from the subsequent loop filter, depending on the setting of the switches 704. Thus, both positive and negative phase errors are enabled to be handled.

The output current of the further charge pump can be essentially proportional to a signed integer phase error output from the further phase detector. The proportionality constant can be made larger than the corresponding one of the main charge pump. This would possibly require that a loop filter zeroing resistor is switched to a smaller value to maintain stability of the PLL. For a fairly simple loop filter comprising a resistor and a capacitor connected in series to ground or a reference voltage, this can be achieved by having a further resistor and a switch connected in parallel with the loop filter zeroing resistor, and where further stability is required, wherein increased stability is achieved with the smaller resistor and the thereby changed bandwidth if the proportionality constant is made larger, the switch is closed and the aggregate zeroing resistance of the loop resistor and the further resistor in parallel will be lower than of the ordinary loop resistor. The switch can, for example, be actuated when the circuit block 113, 213 is enabled.

It should be noted that any of the charge pumps demonstrated with reference to FIGS. 6 and 7 can be used together with any of the phase detectors demonstrated with reference to FIGS. 3 to 5. Other types of charge pumps can also be used together with the demonstrated phase detectors, although the herein demonstrated charge pumps are particularly suitable. The suitability of the respective phase detectors to the PLLs demonstrated with reference to FIGS. 1 and 2 has been elucidated at respective disclosure of the phase detectors. The use of a common analog loop filter is particularly advantageous since the addition of currents from respective main charge pump and the further charge pump enables very simple and efficient circuitry, i.e., just connect them both to the input of the analog loop filter. However, the use of a single loop filter is not essential to the invention, and the further charge pump may be connected to a separate loop filter, and the output voltages of the two loop filters would then be added prior to being applied to the input of the VCO. The concept of the herein demonstrated embodiments can also be used together with a bandwidth switch arranged to temporarily change loop bandwidth, although the herein disclosed embodiments for most applications will make such a solution unnecessary. However, for some applications, the aggregate swiftness of both using the further phase detector and the further charge pump, and also a bandwidth switch, as demonstrated above, can provide an advantageous solution.

Figure 10:
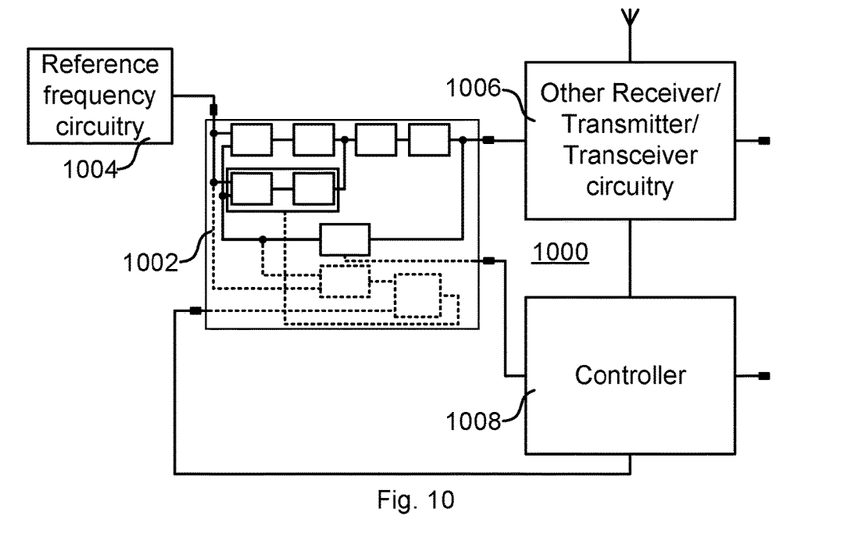
FIG. 10 schematically illustrates a radio circuit according to an embodiment.

FIG. 10 schematically illustrates a radio circuit 1000 according to an embodiment. The radio circuit 1000 comprises a PLL 1002 according to any of the embodiments demonstrated above which is provided with a reference frequency signal from a reference frequency circuitry 1004. The reference frequency circuitry 1004 can comprise a crystal oscillator, possibly with some correction circuitry for environmental fluctuations. The PLL provides its output signal to other radio circuitry 1006 of the radio circuit 1000. The other radio circuitry 1006 can, for example, be a receiver, a transmitter or a transceiver. It is also possible that the radio circuit can comprise more than one PLL 1002, e.g., one PLL providing its output to a receiver and another one providing its output to a transmitter. The radio circuit 1000 can also comprise a controller 1008, which, for example, can provide a division factor to the PLL 1002, and also provide the acquisition request signal to the PLL, as demonstrated above, for example at start-up or change of division factor.

Figure 11:
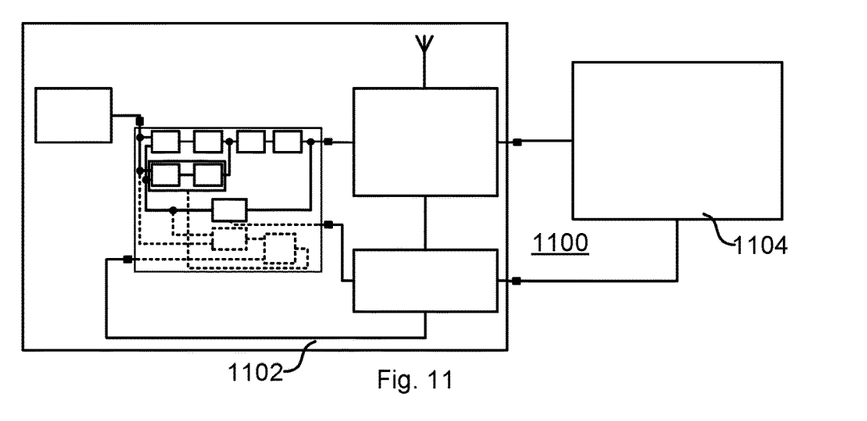
FIG. 11 schematically illustrates a communication device according to an embodiment.

FIG. 11 schematically illustrates a communication device 1100 according to an embodiment. The communication device comprises a radio circuit 1102 according to any of the embodiments demonstrated above. The communication device 1100 also comprises further circuitry and elements 1104 such as input and output devices, interfaces, power supply, etc. The radio circuit 1102 is connected to the further circuitry 1104 for provision or reception of signals that are received or to be transmitted. Further, the further circuitry and elements 1104 can provide control information to a controller of the radio circuitry 1102.

Figure 12:
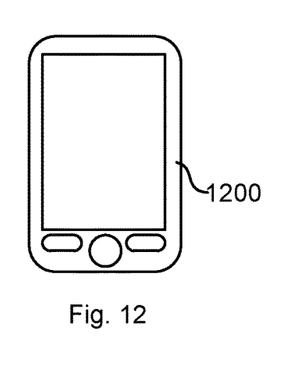
FIG. 12 schematically illustrates an example of a mobile communication device according to an embodiment.

FIG. 12 schematically illustrates an example of a mobile communication device 1200 according to an embodiment. The mobile communication device can be arranged for communication in a cellular communication system and comprise the elements demonstrated above.

Figure 13:
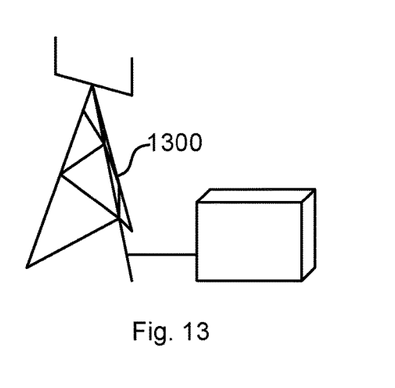
FIG. 13 schematically illustrates an example of a communication node according to an embodiment for operating a cell in a cellular communication system.

FIG. 13 schematically illustrates an example of a communication node 1300 according to an embodiment for operating a cell in a cellular communication system. The communication node 1300 can be arranged to operate a cell in a cellular communication system and comprise the elements demonstrated above.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. An analog phase-locked loop (PLL) comprising:
a voltage controlled oscillator (VCO);
a frequency divider having its input connected to an output of the VCO;
a first phase detector arranged to detect a phase difference between an output signal of the frequency divider and a reference frequency signal and to provide an output signal on an output of the first phase detector based on the phase difference, wherein the detectable phase difference is within one cycle of the reference frequency;
a first charge pump connected to the output of the first phase detector and arranged to output a charge per detected phase difference based on the output signal on the output of the first phase detector;
an analog loop filter connected to the first charge pump and arranged to provide a voltage, based on the output of the first charge pump, to the VCO;
a second phase detector arranged to detect a signed integer number of cycles in phase difference between the output signal of the frequency divider and the reference frequency signal and to provide an output signal on an output of the second phase detector based on the signed integer number of cycles in phase difference; and
a second charge pump connected to the output of the second phase detector and arranged to provide a charge per detected phase difference, based on the output of the second phase detector, to the loop filter.

2. The PLL of claim 1, wherein the second charge pump outputs currents proportional to the signed integer number of cycles in phase difference detected by the second phase detector to the loop filter.

3. The PLL of claim 1, wherein the first and second charge pumps are arranged such that the second charge pump will, when one or more cycles in phase difference are detected by the second phase detector, provide a charge, per detected non-zero phase difference by the second phase detector, with an absolute value that is larger than an absolute value of charge provided by the first charge pump during the same time period.

4. The PLL of claim 1, further comprising a phase lock detector arranged to detect whether the PLL is in a phase-locked state, wherein the second phase detector and the second charge pump are arranged to be switched off when the phase lock detector determines a phase-locked state.

5. The PLL of claim 1, further comprising a control input arranged to receive a signal indicating fast acquisition request, wherein, upon reception of such request, the second phase detector and second charge pump are forced to an on-state.

6. The PLL of claim 1, wherein the second phase detector comprises two edge counters and a subtractor, wherein a first edge counter of the two edge counters is arranged to count edges of the reference frequency signal, a second edge counter of the two edge counters is arranged to count edges of the output signal of the frequency divider, and the subtractor is arranged to subtract a count provided by one of the edge counters from a count provided by the other one of the edge counters, wherein the output signal of the subtractor forms the output signal of the second phase detector.

7. The PLL of claim 1, wherein the second phase detector comprises an up/down counter having one input for up-count and another input for down-count and an output providing an aggregated count formed by the difference in cycles of the inputs, wherein the output signal of the up/down counter forms the output signal of the second phase detector.

8. The PLL of claim 7, wherein the up/down counter comprises two ripple counters, a first set of synchronization registers, a subtractor, and a second set of synchronization registers, wherein the first ripple-counter is arranged to count the reference frequency signal, the second ripple-counter is arranged to count the divided frequency signal, the first set of synchronization registers is arranged to enable the output signal of the second ripple-counter to be synchronously subtracted from the output signal of the first ripple-counter in the subtractor, and the output signal of the subtractor is provided to the second set of synchronization registers to be provided as an output signal of the up/down counter.

9. The PLL of claim 1, wherein the second charge pump comprises a plurality of current sources, connected via respective switches individually controlled by the output signal of the second phase detector, to provide current at the output of the second charge pump, wherein provided respective currents of the plurality of current sources are weighted such that the plurality of current sources together are able to provide an aggregate current, together with the switches, corresponding to the output signal of the second phase detector.

10. The PLL of claim 9, wherein a first current source of the current sources is weighted to provide a double amount of current than a second current source of the current sources, and the second current source is weighted to provide a double amount of current than a third current source of the current sources, and so on, and wherein the switches are controlled based on the output signal of the second phase detector.

11. The PLL of claim 10, further comprising a decoder arranged to receive the output signal of the second phase detector and provide control to the switches such that the provided current corresponds to the phase difference detected and output by the second phase detector.

12. The PLL of claim 9, wherein the current sources are equally weighted, and the switches are controlled to connect an amount of current sources to the output of the second charge pump corresponding to the output signal of the second phase detector.

13. A radio circuit arranged to receive or transmit radio signals, the radio circuit comprising the PLL of claim 1.

14. A communication device for wireless communication, the communication device comprising the radio circuit of claim 13.

15. A communication node arranged to operate a cell in a cellular communication system, the communication node comprising the radio circuit of claim 13.

16. An analog phase-locked loop (PLL) comprising:
a voltage controlled oscillator (VCO);
a frequency divider having its input connected to an output of the VCO;
a first phase detector arranged to detect a phase difference between an output signal of the frequency divider and a reference frequency signal and to provide an output signal on an output of the first phase detector based on the phase difference, wherein the detectable phase difference is within one cycle of the reference frequency;
a first charge pump connected to the output of the first phase detector and arranged to output a charge per detected phase difference based on the output signal on the output of the first phase detector;
an analog loop filter connected to the first charge pump and arranged to provide a voltage, based on the output of the first charge pump, to the VCO;
a second phase detector arranged to detect a signed integer number of cycles in phase difference between the output signal of VCO and the reference frequency signal and to provide an output signal on an output of the second phase detector based on the signed integer number of cycles in phase difference; and
a second charge pump connected to the output of the second phase detector and arranged to provide a charge per detected phase difference, based on the output of the second phase detector, to the loop filter.

17. The PLL of claim 16, wherein the second phase detector comprises two counters and a subtractor, wherein a first counter of the two counters is arranged to count edges of the reference frequency signal, a second counter of the two counters is arranged to count edges of the output signal of the VCO, wherein the first counter is arranged to increase its value for each edge by a product of a division value of the frequency divider and a count provided by the second counter, and the subtractor is arranged to subtract a count provided by one of the edge counters from a count provided by the other one of the edge counters, wherein the output signal of the subtractor forms the output signal of the second phase detector.

18. The PLL of claim 16, wherein the second phase detector comprises an up/down counter having one input for up-count and another input for down-count and an output providing an aggregated count formed by the difference in cycles of the inputs, wherein the output signal of the up/down counter forms the output signal of the second phase detector.

19. The PLL of claim 18, wherein the up/down counter comprises two ripple counters, a first set of synchronization registers, a subtractor, and a second set of synchronization registers, wherein the first ripple-counter is arranged to count the reference frequency signal, the second ripple-counter is arranged to count the divided frequency signal, the first set of synchronization registers is arranged to enable the output signal of the second ripple-counter to be synchronously subtracted from the output signal of the first ripple-counter in the subtractor, and the output signal of the subtractor is provided to the second set of synchronization registers to be provided as an output signal of the up/down counter.

20. The PLL of claim 16, wherein the second charge pump outputs currents proportional to the signed integer number of cycles in phase difference detected by the second phase detector to the loop filter.

* * * * *